United States Patent
Sato

(10) Patent No.: US 9,208,983 B2
(45) Date of Patent: Dec. 8, 2015

(54) ION GENERATION METHOD AND ION SOURCE

(71) Applicant: SEN Corporation, Tokyo (JP)

(72) Inventor: Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/011,575

(22) Filed: Aug. 27, 2013

(65) Prior Publication Data

US 2014/0062286 A1   Mar. 6, 2014

(30) Foreign Application Priority Data

Aug. 28, 2012  (JP) ................................ 2012-187168

(51) Int. Cl.
   *H01J 37/08*  (2006.01)
   *H01J 1/20*   (2006.01)
   *H01J 5/10*   (2006.01)
   *H01J 27/08*  (2006.01)

(52) U.S. Cl.
   CPC . *H01J 5/10* (2013.01); *H01J 27/08* (2013.01); *H01J 37/08* (2013.01); *H01J 2237/082* (2013.01); *H01J 2237/31701* (2013.01)

(58) Field of Classification Search
   CPC .... H01J 5/08–5/12; H01J 37/08; H01J 37/16; H01J 37/147; H01J 27/08
   USPC ....................................................... 313/231.4
   See application file for complete search history.

(56) References Cited

U.S. PATENT DOCUMENTS

| | | | | | |
|---|---|---|---|---|---|
| 4,354,113 | A | * | 10/1982 | Goode et al. | 250/423 R |
| 5,554,852 | A | * | 9/1996 | Bright et al. | 250/492.21 |
| 5,857,885 | A | * | 1/1999 | Laou et al. | 445/24 |
| 2008/0129180 | A1 | * | 6/2008 | Murrell et al. | 313/337 |
| 2008/0237496 | A1 | | 10/2008 | Gupta | |
| 2009/0242793 | A1 | * | 10/2009 | Low et al. | 250/424 |
| 2010/0024841 | A1 | * | 2/2010 | Koo et al. | 134/1.1 |
| 2010/0148088 | A1 | * | 6/2010 | Radovanov et al. | 250/424 |
| 2011/0240878 | A1 | * | 10/2011 | Beniveniste et al. | 250/424 |
| 2012/0013249 | A1 | * | 1/2012 | Jerez | 313/613 |

FOREIGN PATENT DOCUMENTS

| | | | |
|---|---|---|---|
| JP | 06-223771 A | 8/1994 | |
| JP | 06-310065 A | 11/1994 | |
| JP | 07-262946 A | 10/1995 | |
| JP | 09-259779 A | 10/1997 | |
| JP | 11-025872 A | 1/1999 | |
| JP | 2001-167707 A | 6/2001 | |
| JP | 2001-312991 A | 11/2001 | |
| JP | 3899161 B2 | 3/2007 | |
| JP | 2010-522966 A | 7/2010 | |
| WO | WO-2010/123707 A2 | 10/2010 | |

* cited by examiner

*Primary Examiner* — Sikha Roy

(74) *Attorney, Agent, or Firm* — Michael Best & Friedrich LLP

(57) ABSTRACT

An ion generation method uses a direct current discharge ion source provided with an arc chamber formed of a high melting point material, and includes: generating ions by causing molecules of a source gas to collide with thermoelectrons in the arc chamber and producing plasma discharge; and causing radicals generated in generating ions to react with a liner provided to cover an inner wall of the arc chamber at least partially. The liner is formed of a material more reactive to radicals generated as the source gas is dissociated than the material of the arc chamber.

14 Claims, 7 Drawing Sheets

ION GENERATION METHOD AND ION SOURCE

BACKGROUND OF THE INVENTION

1. Field of the Invention

The present invention relates to an ion generation method and an ion source.

2. Description of the Related Art

One of the standard processes in semiconductor manufacturing is to implant ions into a semiconductor wafer for the purpose of modifying conductivity or modifying the crystal structure of the semiconductor wafer. Apparatus used in the steps are generally called ion implanter.

Direct current (DC) discharge ion sources are known to be used in ion implanter. A DC discharge ion source is configured to heat a filament by a direct current so as to generate thermoelectrons, which heat the cathode. The thermoelectrons generated from the heated cathode are accelerated in an arc chamber and collide with source gas molecules introduced into the arc chamber, thereby ionizing atoms included in the source gas molecules (see patent document 1).

[patent document 1] Japanese patent 3516262

Halides such as fluorides or chlorides are often used as source gas molecules introduced into the arc chamber. The source gas molecules comprising halides generate halogen radicals in the process of ionization. The halogen radicals react with parts used to build an ion source (e.g., a metal member of the inner wall of the arc chamber) and are chemically bonded to the member. The chemically bonded metal member is ionized along with the source gas molecules and is extracted as an ion beam from the ion source.

There is a concern that the ionized metal member of the inner wall of the arc chamber ends up being implanted into the semiconductor wafer, contaminating the wafer with impurity ions such as metal ions. In particular, in the case of a direct current discharge ion source, the arc chamber is heated inside to a high temperature. This is sometimes addressed by making the inner wall of the arc chamber of a high melting point metal such as molybdenum (Mo), tungsten (W), tantalum (Ta), etc. However, such contamination due to a high melting point metal may preferably be reduced as much as possible in order to improve the performance of the semiconductor device.

SUMMARY OF THE INVENTION

The present invention addresses the issue described above and a purpose thereof is to provide a technology of inhibiting the reaction of radicals with parts used to build an ion source, and, in particular, on an arc chamber.

To address the issue, an ion generation method according to at least one embodiment of the present invention uses a direct current discharge ion source provided with an arc chamber formed of a high melting point material, and comprises: generating ions by causing molecules of a source gas to collide with thermoelectrons in the arc chamber and inducing plasma discharge; and causing radicals generated in generating ions to react with a liner provided to cover an inner wall of the arc chamber at least partially. The liner is formed of a material more reactive to radicals generated as the source gas is dissociated than the material of the arc chamber.

Another embodiment of the present invention relates to an ion source. The ion source comprises an arc chamber formed of a high melting point material; a thermoelectronic emission unit configured to emit thermoelectrons in the arc chamber; a gas introduction port configured to guide a source gas into the arc chamber; a liner configured to cover an inner wall of the arc chamber at least partially; and an opening configured to extract ions generated in the arc chamber. The liner may be formed of a material more reactive to radicals generated as the source gas is dissociated than the material of the arc chamber.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A detailed description will now be given of the embodiments of the present invention with reference to the attached drawings. Like numerals represent like elements so that the description will be omitted accordingly. The configurations described below are by way of examples only and are non-limiting.

(First Embodiment)

Figure 1:
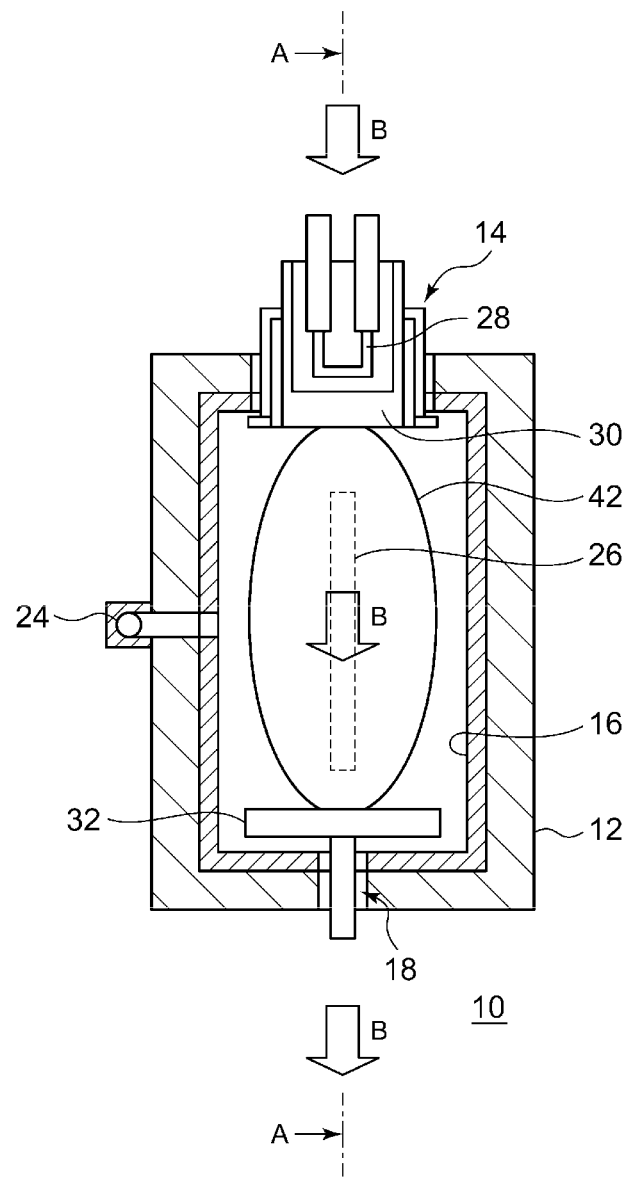
FIG. 1 is a schematic diagram showing the interior of the arc chamber of an ion source according to the first embodiment.
Figure 2:
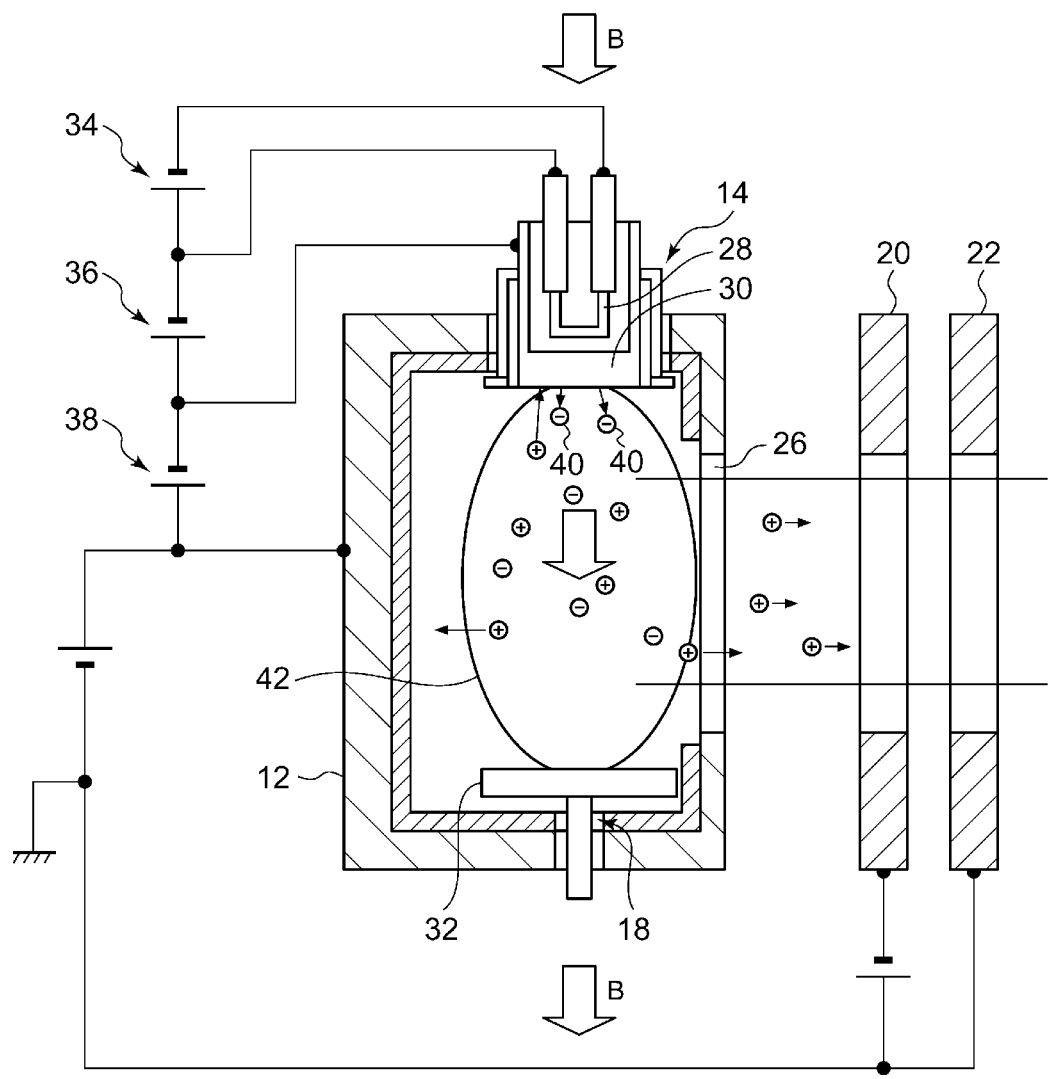
FIG. 2 is a schematic diagram showing the A-A cross section of the ion source shown in FIG. 1.

FIG. 1 is a schematic diagram showing the interior of the arc chamber of an ion source according to the first embodiment. FIG. 2 is a schematic diagram showing the A-A cross section of the ion source shown in FIG. 1.

The ion source 10 according to the first embodiment is a DC discharge ion source and comprises an arc chamber 12, a thermoelectronic emission unit 14, a liner 16, a repeller 18, a suppression electrode 20, a ground electrode 22, and various power supplies.

The arc chamber 12 is formed with a gas introduction port 24 for introducing a source gas and a front slit 26 provided as an opening through which an ion beam is extracted.

The thermoelectronic emission unit 14 emits thermoelectrons in the arc chamber and includes a filament 28 and a cathode 30. The repeller 18 is provided to face the thermoelectronic emission unit 14 and includes a repeller plate 32. The cathode 30 and the repeller plate 32 are provided to face each other so as to be substantially parallel to each other. The liner 16 is provided cover the inner wall of the arc chamber 12.

The filament 28 is heated by a filament power supply 34 and generates thermoelectrons at an end thereof. (Primary) thermoelectrons generated by the filament 28 are accelerated by a cathode power supply 36 and collide with the cathode 30 so as to heat the cathode 30 with the heat occurring upon collision. The cathode 30 as heated generates (secondary) thermoelectrons 40. The (secondary) thermoelectrons 40 are accelerated by an arc voltage applied by an arc power supply 38 between the cathode 30 and the arc chamber 12 and are exhausted into the arc chamber 12 as beam electrons having sufficient energy to ionize gas molecules.

An external magnetic field B induced by a source magnetic field coil is applied in the ion source 10 in an axial direction connecting the cathode 30 and the repeller 18. Since the repeller 18 is provided to face the cathode 30 configured to emit beam electrons, the beam electrons travel back and forth between the cathode 30 and the repeller 18 along the magnetic field B, colliding with and dissociating the source gas molecules introduced into the arc chamber 12 and producing ions. As a result, a plasma 42 is generated in the arc chamber 12. The beam electrons are substantially localized in a range defined by the applied magnetic field so that ions are primarily generated in that range. Beam electrons that are diffused reach the inner wall of the arc chamber 12, the front slit 26, the cathode 30, and the repeller 18 and are lost in the wall surface.

The ion source 10 according to the embodiment is a DC discharge ion source configured to emit (secondary) thermoelectrons 40 so that the arc chamber 12 is heated inside to a high temperature. Therefore, the arc chamber 12 is formed of a high melting point material. More specifically, the arc chamber 12 is formed of a high melting point metal such as tungsten (W), molybdenum (Mo), and tantalum (Ta), or an alloy thereof, or graphite (C), etc. This makes the arc chamber hard to melt even in an environment as prevails in a DC discharge ion source in which the arc chamber is heated inside to a high temperature.

Noble gas such as Ar, hydrides such as $H_2$, $PH_3$, and $AsH_3$, halides (fluorides such as $BF_3$ and $GeF_4$, chlorides such as $InCl_3$), and oxides such as $CO_2$ and CO are used as a source gas. The source gas is introduced into the arc chamber 12 and is ionized by (secondary) thermoelectrons 40. As the excited ions are incident on and collide with the inner wall of the arc chamber 12, the front slit 26, the cathode 30, and the repeller 18, the ions wear away components (W, Ta, Mo, graphite, etc.) of the respective parts by sputtering. If the source gas is a fluoride (e.g., $BF_3$), ionization produces $B^+$, $BF^+$, $BF^{2+}$, $F+$, and $F^{2+}$. As these ions are neutralized by the wall surface inside the arc chamber 12, highly-reactive fluorine radicals like F, $F^2$, etc. (normally used in etching a Si or $SiO_2$ film in a semiconductor manufacturing process) are generated.

Fluorine radicals chemically react with a material of parts used to build the ion source 10, turning into fluorides such as $WF_x$, $TaF_x$, $MoF_x$, $CF_x$, etc. These fluorides are gasified at a relatively low temperature and so are ionized in the arc chamber along with the introduced source gas. The gasified fluorides are extracted as $W^+$, $Ta^+$, $Mo^+$, etc. ion beams along with the primary ion beam from the introduced source gas.

In ion implantation processes these days, there is strict requirement for reduction of metal contamination from ions ($W^+$, $Ta^+$, $Mo^+$, etc. ions) of heavy metal such as a high melting point metal due to a need to improve the performance of a semiconductor device. On the other hand, it is not favorable that fluorine contained in the ion source gas and the high melting point material of the arc chamber 12, etc. that forms the ion source are chemically bonded and gasified and extracted from the arc chamber 12 as contaminant ions.

Heavy metal ions extracted as an ion beam are deposited in the beamline. Some of the ions reach the part subject to ion implantation, contaminating the wafer subject to implantation with heavy metal and reducing the yield of semiconductor devices. Additionally, fluorine radicals corrode high-temperature parts (cathode, repeller, front slit, arc chamber, etc.) of the ion source in a short period of time and are deposited on some high-temperature members, causing a problem like insulation failure. This necessitates frequent exchange of parts. As a result, the maintenance cycles of the ion source and the ion implanter provided with the ion source are reduced and the productivity thereof is lowered.

We made a careful study and devised the following technology. We have devised a way to reduce the amount of heavy metal ions originating from parts in the ion source 10 and included in the ion beam, by efficiently decreasing highly reactive radicals originating from halides (fluorides or chlorides) from a source material generated in a high-temperature ion source so as to prevent chemical bonding with the arc chamber 12 which is formed of a high melting point metal to build an ion source. The technology can also reduce wear of parts such as the arc chamber 12 used to build the ion source 10 and extend the life of the ion source 10.

With this knowledge in the background, it should be known that the ion generation method according to the embodiments is a method using the DC discharge ion source 10 provided with the arc chamber 12 formed of a high melting point material. The ion generation method comprises an ion generation step of generating ions by inducing plasma discharge by colliding source gas molecules and thermoelectrons 40 in the arc chamber 12, and a reaction step of causing radicals generated in the ion generation step to react with the liner 16 provided to cover the inner wall of the arc chamber 12 at least partially. The liner 16 is formed of a material more reactive to radicals generated as the source gas is dissociated than the material of the arc chamber 12.

This decreases radicals in the arc chamber 12 of the ion source 10 due to the reaction between radicals and the liner 16 and mitigates the reaction of radicals on parts of the ion source other than the liner 16 (e.g., the arc chamber 12, repeller 18, front slit 26, cathode 30). Thus, the amount of the high melting point material of the arc chamber 12 extracted as ions from the front slit 26 is reduced since the reaction on the arc chamber 12 is mitigated.

The source gas according to the embodiments is a halide gas or an oxide gas. More specifically, the source gas is of at least one type selected from the group consisting of $BF_3$, $GeF_4$, $PF_3$, $InCl_3$, InI, InBr, $CO_2$, and CO. These types of gas can maintain gaseous status even at a high temperature and so is suitable as a source gas in a DC discharge ion source.

A halide source gas (e.g., a fluoride such as $BF_3$ or $GeF_4$) introduced into the arc chamber 12 of the ion source 10 encounters intended dopant ions as described above and is turned into a plasma in the arc chamber 12, producing various types of ions. In the case of $BF_3$, for example, generated ions include $B^+$, $BF^+$, $BF^{2+}$, $F^+$, and $F^{2+}$. Some of the ions are extracted from the opening of the front slit 26 and are subject to mass separation with the result that only $B^+$ or $BF^{2+}$ ions are implanted into the semiconductor wafer. However, most of the ions flow into the surface of the arc chamber 12, the cathode 30, and the repeller 18 and are neutralized accordingly.

Of these ions, $F^+$ or $F^{2+}$ ions are neutralized and turned into fluorine radicals such as F and $F_2$. Highly reactive fluorine radicals are adsorbed by the inner wall of the arc chamber 12 and are chemically bonded to the material forming the wall surface (W, Mo, Ta, C, etc.), producing $WF_x$, $MoF_x$, $TaF_x$, $CF_x$, etc. These fluorides are vaporized at a relative low temperature of several hundred degrees or lower. Thus, fluorides are vaporized from the wall surface of the arc chamber, which reaches 600° C. or higher (or 1000° C. or higher, or 1500° C. or higher) when the ion source 10 is in operation and is generating ions, corroding the inner wall of the arc chamber 12.

Vaporized fluorides are subject to heat decomposition around the cathode 30 or on the surface of the repeller 18 at a high temperature. A halogen cycle occurs in which F is dissociated, and W, Mo, Ta, C, etc. are deposited. Corrosion or deposition caused by fluorine radicals in the arc chamber 12 could result in insulation failure or reduction in beam performance due to deformation of the associated member or decrease in the initial gap.

For the purpose of removing radicals efficiently, the liner 16 according to the embodiment is formed of silicon (Si) having a low melting point than a high melting point material like W, Mo, Ta, C, etc. For etching of crystalline Si or poly Si in a semiconductor process, $CF_4$ plasma is often used. In comparison with a high melting point metal or carbon (C), Si reacts with fluorine radicals and $CF_2$ radicals in the $CF_4$ plasma highly selectively.

The reaction is denoted by:

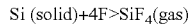

$$Si\,(solid) + 4F > SiF_4(gas)$$

In other words, the liner 16 formed of Si functions as a sacrificial member more easily etched than the high melting point member. Further, Si of the liner 16 is exhausted as a $SiF_4$ gas so that Si is etched efficiently. Another way of describing the feature is that Si located where fluorine radicals are generated efficiently removes fluorine radicals. This is equally true in the case of oxide radicals. The exhausted gas may contain silicon compounds like $SiF_3$, SiO, $SiO_2$, etc.

Thus, the ion generation method according to the embodiment further comprises exhausting, from the ion source 10, a compound gas ($SiF_4$) produced in the previous step by reaction between radicals and the material forming the liner (Si). This can exhaust radicals efficiently outside the arc chamber 12 as a compound gas.

The liner 16 used in the reaction may be formed of a material including germanium (Ge) and silicon carbide (SiC) instead of Si as mentioned above. The purity of Si is preferably 99.999% or higher.

Si may be in the form of monocrystalline silicon. Monocrystalline silicon is etched by radicals at a rapid rate. So, it is possible to turn radicals into a compound gas efficiently. Monocrystalline silicon may be oriented such that the (100) face is exposed to the plasma generated in the arc chamber. The (100) face of monocrystalline silicon is etched by radicals at a rapid rate. So, it is possible to turn radicals into a compound gas efficiently.

Silicon may be in the form of polycrystalline silicon or amorphous silicon. Polycrystalline silicon and amorphous silicon are etched at a slow rate than monocrystalline silicon. So, the life of the liner can be extended.

To describe the embodiment in an alternative language, the ion source 10 comprises an arc chamber 12 formed of a high melting point material, a thermoelectronic emission unit 14 configured to emit thermoelectrons in the arc chamber 12, a gas introduction port 24 configured to guide a source gas into the arc chamber 12, a liner 16 configured to cover the inner wall of the arc chamber 12 at least partially, and a front slit 26 configured to extract ions generated in the arc chamber 12. The liner 16 is formed of a material more reactive to radicals generated as the source gas is dissociated than the material of the arc chamber 12.

At least a part of the liner 16 may be in contact with the arc chamber 12. This can dissipate heat of the liner outside via the arc chamber.

Instead of providing the liner 16 separate from the arc chamber 12, the surface of the arc chamber 12, the ion source 10, or other components may be coated with a material such as Si or Ge. The material for coating may be selected from monocrystal, polycrystal, and amorphous.

Figure 3:
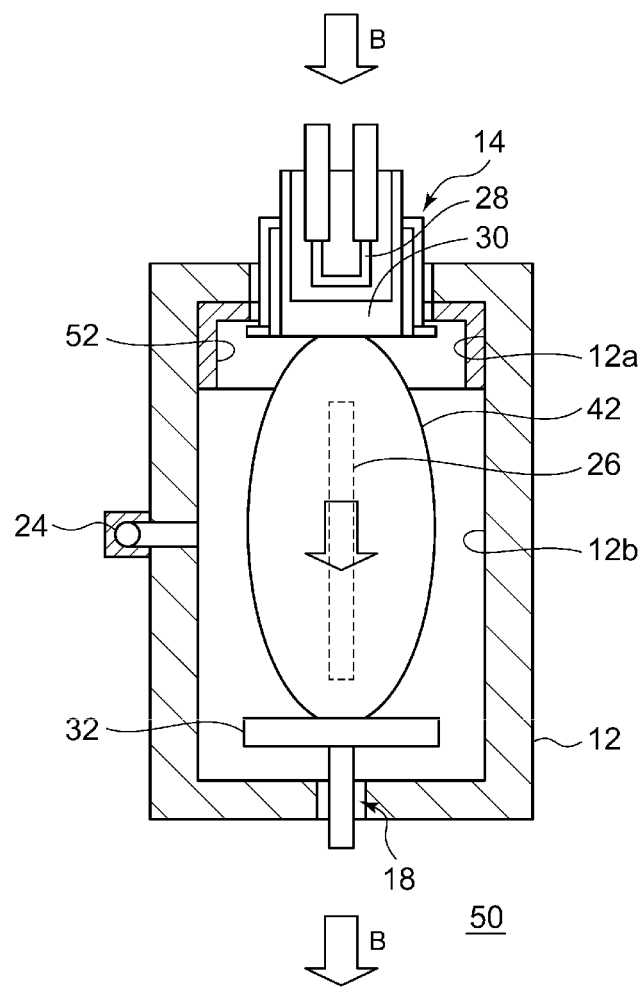
FIG. 3 is a schematic diagram showing the interior of the arc chamber of the ion source according to the second embodiment.

(Second Embodiment) FIG. 3 is a schematic diagram showing the interior of the arc chamber of the ion source according to the second embodiment. An ion source 50 according to the second embodiment is different from the ion source 10 according to the first embodiment in respect of the shape of the liner.

The arc chamber 12 in the ion source 50 includes a liner-lined area 12a covered by a liner 52 in the neighborhood of the thermoelectronic emission unit 14, and an exposed area 12b not covered by the liner 52. Radicals are likely to be generated in the neighborhood of the thermoelectronic emission unit 14 so that radicals can be efficiently removed by locating the liner 52 in the neighborhood of the thermoelectronic emission unit 14. Meanwhile, by providing the exposed area 12b not covered by the liner, the amount of the liner 52 can be reduced so that the material forming the liner 52 is prevented from being turned into an ion beam in an excessive amount.

Figure 4:
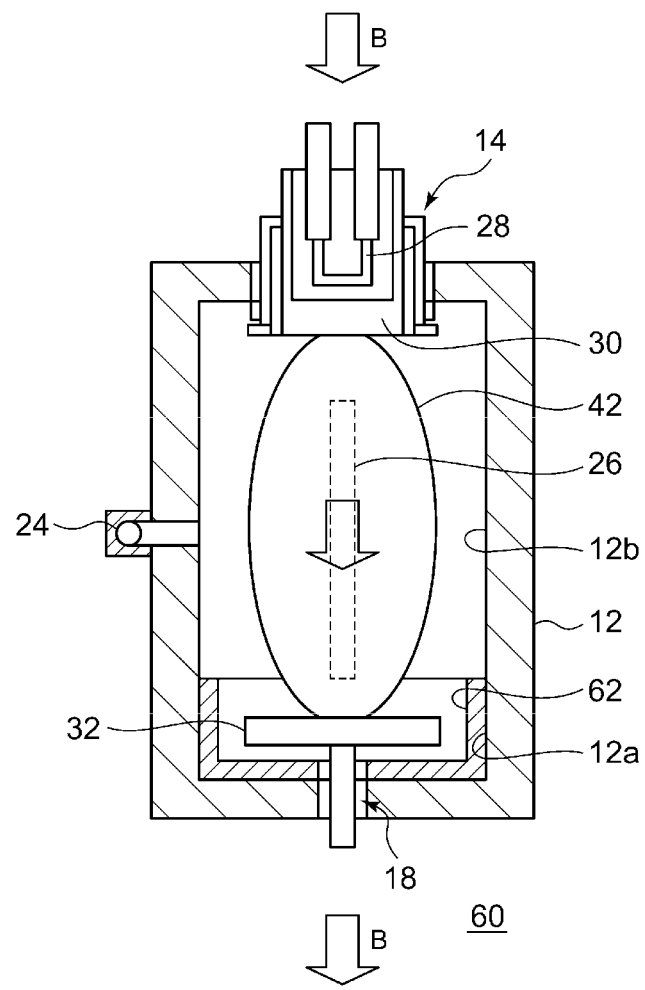
FIG. 4 is a schematic diagram showing the interior of the arc chamber of the ion source according to the third embodiment.

(Third Embodiment) FIG. 4 is a schematic diagram showing the interior of the arc chamber of the ion source according to the third embodiment. An ion source 60 according to the third embodiment is different from the ion source 10 according to the first embodiment in respect of the shape of the liner.

The arc chamber 12 in the ion source 60 is provided with a liner-lined area 12a covered by a liner 62 in the neighborhood of the repeller 18 opposite to the thermoelectronic emission unit 14, and an exposed area 12b not covered by the liner 62. Radicals are likely to be generated in the neighborhood of the repeller 18 so that radicals can be efficiently removed by locating the liner 62 in the neighborhood of the repeller 18. Meanwhile, by providing the exposed area 12b not covered by the liner 62, the amount of the liner 62 can be reduced so that the material forming the liner 62 is prevented from being turned into an ion beam in an excessive amount.

Figure 5:
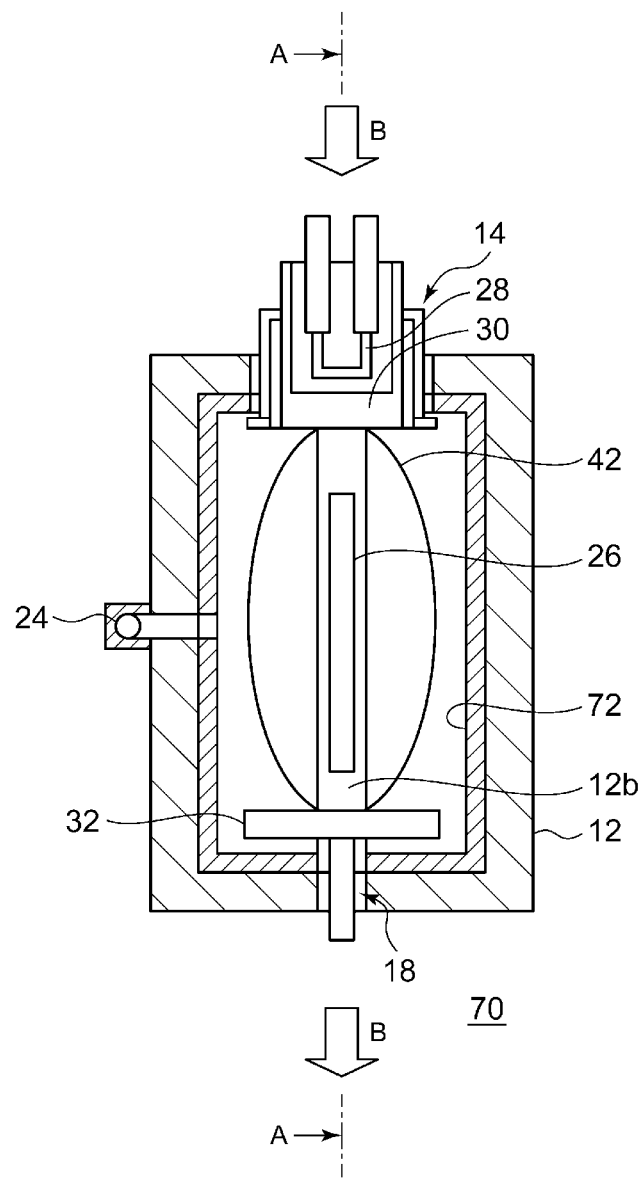
FIG. 5 is a schematic diagram showing the interior of the arc chamber of the ion source according to the fourth embodiment.

(Fourth Embodiment) FIG. 5 is a schematic diagram showing the interior of the arc chamber of the ion source according to the fourth embodiment. The arc chamber 12 in an ion source 70 is provided with an exposed area 12b not covered by a liner in the neighborhood of the front slit 26. A liner 72 is etched by radicals and so reduced in volume. Therefore, if the liner is arranged to reach the edge of the front slit 26, the neighborhood of the opening is deformed over time resulting in the shape of an ion beam extracted from the front slit 26 becoming unstable. The shape of an ion beam can be stabilized by not covering the neighborhood of the front slit 26 by the liner 72.

An ion beam is extracted from the plasma diffused to reach the front slit 26 and via a slit parallel to the magnetic field. The performance of ion beam extraction, namely, the amount of beam current and the divergence of the beam, are largely affected by abrasion of the front slit part and by deformation of the opening due to decomposition of source materials. Abrasion and deformation reduce the implantation beam current reaching the part subject to ion implantation and lower the productivity of the.

By using the liner shape according to the embodiment, corrosion of the neighborhood of the front slit 26 by fluorine radicals and deposition of the source material are reduced so that deformation of the opening is mitigated. Accordingly, the beam shape is affected less seriously and stable operation of the ion implanter is maintained.

(Fifth Embodiment)

Figure 6:
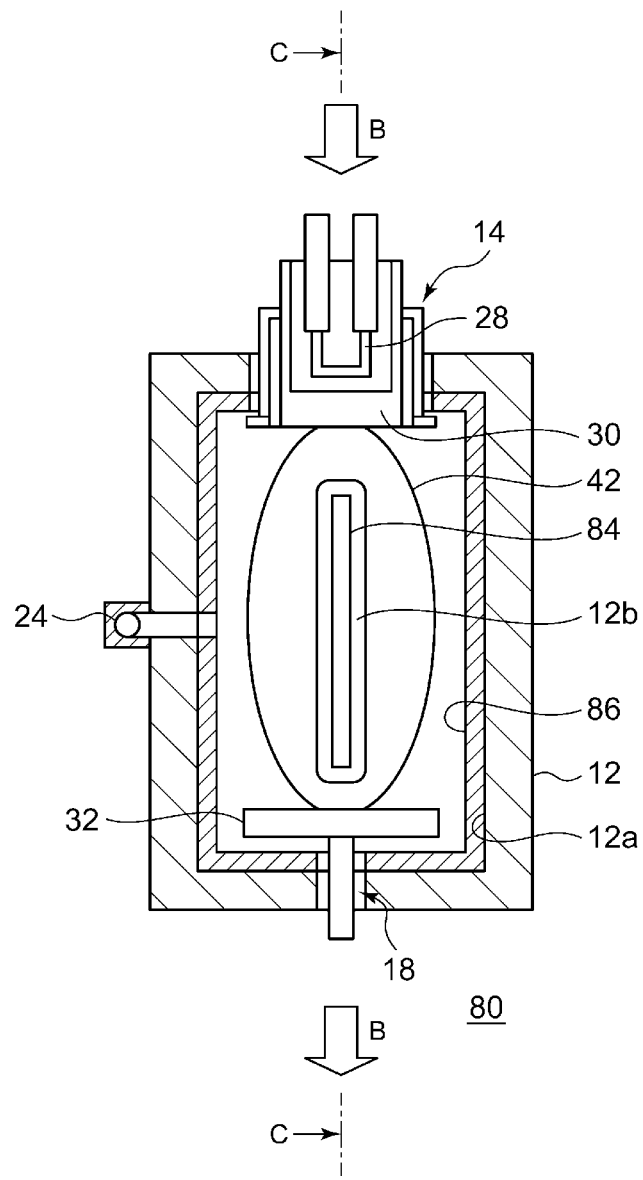
FIG. 6 is a schematic diagram showing the interior of the arc chamber of the ion source according to the fifth embodiment.
Figure 7:
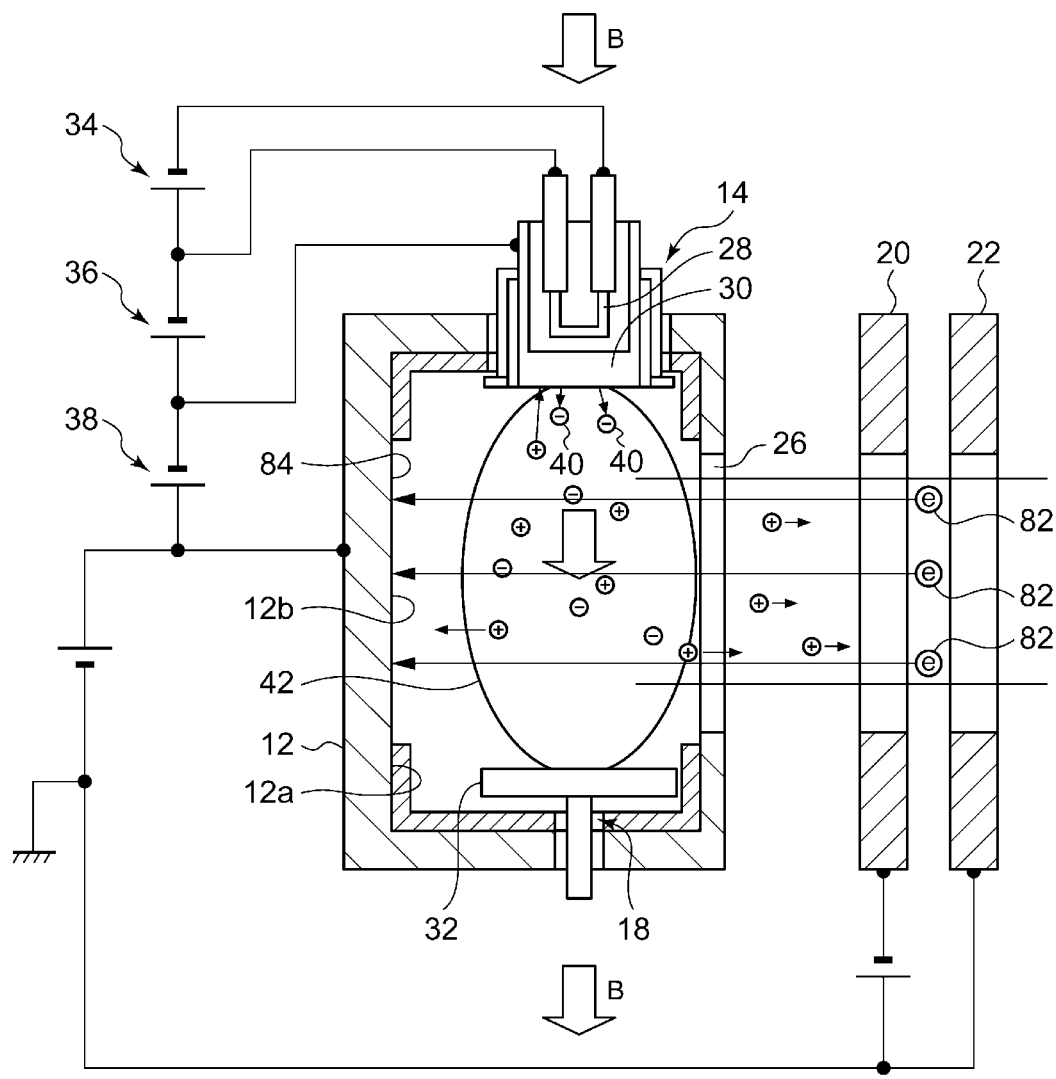
FIG. 7 is a schematic diagram showing the C-C cross section of the ion source shown in FIG. 6.

FIG. 6 is a schematic diagram showing the interior of the arc chamber of the ion source according to the fifth embodiment. FIG. 7 is a schematic diagram showing the C-C cross section of the ion source shown in FIG. 6.

The arc chamber 12 in an ion source 80 is provided, in a part of the arc chamber inner wall opposite to the front slit 26, with an exposed area 12b not covered by a liner. In the process of extracting an ion beam, high-energy back stream electrons 82 enter the arc chamber 12 via the front slit 26 and collide with the arc chamber inner wall opposite to the front slit 26. This heats a back stream irradiation part 84 shown in FIG. 6 to a high temperature with the result that a liner 86 may be melted. Melting of the liner 86 is prevented by not covering the arc chamber inner wall opposite to the front slit 26 by the liner 86.

As described above, a Si liner provided in an arc chamber of an ion source that is operated at a high temperature and that contains a fluoride used as a source gas causes fluorine radicals to be exhausted efficiently in the form of $SiF_4$ or $SiF_2$. Therefore, corrosion and deposition of a high melting point metal, carbon, etc. are mitigated. Consequently, the life of the source is significantly extended.

By covering the inner wall of the arc chamber by a Si liner, the volume of heavy metal or fluorides of carbon is reduced. This reduces the volume of heavy metal ions in the extracted beam significantly and reduces contamination from heavy metal.

In an ordinary ion source and beam extraction system, insulators are provided to apply a voltage to the extraction electrode. As heavy metal ions and carbon ions are extracted, those ions are attached to the surface of the insulator, causing insulation failure. In the case of a Si liner as taught in the embodiments, $Si^+$ ions produced by ionization of the generated $SiF_4$ gas are also extracted. However, Si is insulative and so does not cause insulation failure even if $Si^+$ ions are deposited. Therefore, the insulation performance of the extraction electrode and of the neighborhood of the ion source is improved so that the beam is stabilized.

The embodiment described above is non-limiting and it will be obvious to those skilled in the art that combination or replacement of features of the embodiments will also be encompassed by the present invention. Modifications to the combination or the sequence of steps according to the embodiments or modifications to the design, etc. according to the embodiments on the basis of the knowledge of a skilled person will also be possible, and the embodiments modified as such will also be within the scope of the present invention.

The liner as described above may have a thickness (e.g., 1 mm or more) sufficient to prevent penetration by corrosion over the requested lifetime of the ion source. In the case of a monocrystalline Si plate liner, the plate may be cut along the cleavage to maintain strength during a high-temperature operation. The surface of the liner in contact with the plasma may be mirror-finished. The liner may be a Si substrate directly cut from an ingot to reduce the cost. Alternatively, the liner may be a laminate of a plurality of thin Si substrates.

The thermoelectronic emission unit 14 may be an electron impact ion source in which a source gas is directly ionized by (primary) thermoelectrons generated from a filament, or an indirectly heated electron impact ion source in which (primary) thermoelectrons generated from a filament are caused to collide with the cathode cap to generate (secondary) thermoelectrons 40 from the cathode cap.

The parts of the liner in the neighborhood of the gas introduction port 24 and the front slit 26 may be formed of graphite and the other parts of Si.

In the case of a monocrystalline Si liner, the crystal may be cut along the cleavage. This maintains the strength during a high-temperature operation.

The roughness of the surface of the liner may be controlled such that the area in contact with the plasma is more rough than elsewhere to increase the surface area so that reactions with fluorine radicals, etc. is promoted.

The ion sources described above may be operated such that a Si beam originating from the liner provides a source of ions. Plasma may be generated by other means such as an RF antenna.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2012-187168, filed Aug. 28, 2012, the entire content of which is incorporated herein by reference.

What is claimed is:

1. An ion generation method using a direct current discharge ion source provided with an arc chamber formed of a high melting point material, comprising:
   generating ions by causing molecules of a source gas to collide with thermoelectrons in the arc chamber and inducing plasma discharge;
   extracting ions generated in the arc chamber from an opening;
   causing radicals generated in generating ions to react with a liner in contact with an inner wall of the arc chamber and provided to cover the inner wall of the arc chamber at least partially,
   wherein the liner is formed of a material more reactive to radicals generated as the source gas is dissociated than the material of the arc chamber, and
   the arc chamber is provided, in a part of the arc chamber inner wall opposite to the opening, with a first exposed area not covered by the liner, and provided, in a neighborhood of the opening, a second exposed area of the inner wall not covered by the liner,
   the liner is provided, in a part of the inner wall formed with the opening, with a lined part covering a neighborhood of the second exposed area, and
   the lined part is disposed between a plasma generated in the arc chamber and the inner wall formed with the opening.

2. The ion generation method according to 1, further comprising exhausting, from the ion source, a compound gas produced by reaction between radicals and the material forming the liner.

3. The ion generation method according to 1, wherein the liner used in a reaction with ions is formed of a material including silicon or germanium.

4. The ion generation method according to claim 3, wherein the silicon is monocrystalline silicon.

5. The ion generation method according to claim 4, wherein the monocrystalline silicon is oriented such that a (100) face is exposed to a plasma generated in the arc chamber.

6. The ion generation method according to claim 3, wherein the silicon is polycrystalline silicon.

7. The ion generation method according to claim 3, wherein the silicon is amorphous silicon.

8. The ion generation method according to claim 1, wherein the source gas is a halide gas or an oxide gas.

9. The ion generation method according to claim 1,
wherein the source gas is of at least one type selected from the group consisting of $BF_3$, $GeF_4$, $PF_3$, $InCl_3$, InI, InBr, $CO_2$, and CO.

10. The ion generation method according to claim 1,
wherein the high melting point material includes atoms of at least one of tungsten, molybdenum, tantalum, and carbon.

11. The ion generation method according to claim 1,
wherein the temperature in the arc chamber reaches 600° C. or higher while ions are generated.

12. An ion source comprising:
an arc chamber formed of a high melting point material;
a thermoelectronic emission unit configured to emit thermoelectrons in the arc chamber;
a gas introduction port configured to guide a source gas into the arc chamber;
a liner that is in contact with an inner wall of the arc chamber and configured to cover an inner wall of the arc chamber at least partially; and
an opening configured to extract ions generated in the arc chamber,
wherein the liner is formed of a material more reactive to radicals generated as the source gas is dissociated than the material of the arc chamber, and
the arc chamber is provided, in a part of the arc chamber inner wall opposite to the opening, with a first exposed area not covered by the liner, and provided, in a neighborhood of the opening, a second exposed area of the inner wall not covered by the liner,
the liner is provided, in a part of the inner wall formed with the opening, with a lined part covering a neighborhood of the second exposed area, and
the lined part is disposed between a plasma generated in the arc chamber and the inner wall formed with the opening.

13. The ion source according to claim 12,
wherein the arc chamber comprises:
a liner-lined area covered by the liner in the neighborhood of the thermoelectronic emission unit; and
an exposed area not covered by the liner.

14. The ion source according to claim 12,
wherein the arc chamber comprises:
a liner-lined area covered by the liner in the neighborhood of a repeller opposite to the thermoelectronic emission unit; and
an exposed area not covered by the liner.

* * * * *